United States Patent [19]

Wolfendale

[11] 4,187,459

[45] Feb. 5, 1980

[54] DIGITAL MEASUREMENT OF IMPEDANCE RATIOS

[75] Inventor: Peter C. F. Wolfendale, Milton Keynes, England

[73] Assignee: Automatic Systems Laboratories Limited, Bedfordshire, England

[21] Appl. No.: 877,542

[22] Filed: Feb. 13, 1978

[51] Int. Cl.² .............................................. G01R 27/26
[52] U.S. Cl. .................................................. 324/60 C
[58] Field of Search ............. 324/60 C, 60 R, 60 CD

[56] References Cited

U.S. PATENT DOCUMENTS

| | | | |
|---|---|---|---|
| 3,325,727 | 6/1967 | Haas | 324/60 R |
| 3,713,022 | 1/1973 | McRay | 324/60 C |
| 3,947,760 | 3/1976 | Noguchi et al. | 324/60 CD X |

*Primary Examiner*—Stanley T. Krawczewicz

*Attorney, Agent, or Firm*—Pollock, Vande Sande and Priddy

[57] ABSTRACT

A circuit arrangement for measuring the ratio of first and second capacitances of a capacitance displacement transducer. An alternating signal is developed the amplitude of which is proportional to the values of the first and second capacitances during respective first and second timing periods, the alternating signal being synchronously demodulated in one phase in the first period and in the opposite phase in the second period. The demodulated signal is integrated so that the integrator is charged and discharged during the first and second periods respectively, and the ratio of the discharge time to the charge time is equal to the ratio of the two capacitances. A digitized output is provided by means of a clock pulse generator and counter.

6 Claims, 2 Drawing Figures

DIGITAL MEASUREMENT OF IMPEDANCE RATIOS

BACKGROUND OF THE INVENTION

This invention relates to arrangements for the measurement of impedance, and more particularly to such arrangements intended for the measurement of the ratio of two capacitances such as those which constitute the components of a differential capacitance displacement transducer, for example.

SUMMARY OF THE INVENTION

It is an object of the present invention to provide a circuit arrangement for digitizing low loss small value capacitance displacement transducers with great accuracy and low cost.

The invention provides a circuit arrangement for measuring the ratio of the values of two electrical capacitances, said arrangement comprising means for connection with first and second capacitors for response to first and second values of a control signal to develop an alternating signal with an amplitude having respective first and second values the ratio of which is a function of the ratio of the capacitances of said first and second capacitors, synchronous demodulator means connected to demodulate said alternating signal and responsive to said first and second values of said control signal to demodulate the signal in respective opposite phases so as to provide a demodulated signal with a magnitude proportional to the amplitude of said alternating signal and a polarity which reverses when said control signal changes from said first to said second value, integrator means connected to receive said demodulated signal to provide an integral signal related directly to the time-integral thereof, and control means providing said control signal and responsive to a threshold value of said integral signal to provide said first value of said control signal for a first time interval of selected duration and then to provide said second value of said control signal for a second time interval terminated by return of the value of said integral signal to said threshold value, whereby, in one cycle of operation, said integrator means is charged in one sense in response to said first value of said control signal and in the opposite sense in response to said second value of said control signal, and the ratio of the durations of said second and first time intervals is substantially equal to the ratio of said first and second values of said amplitude of said alternating signal.

DESCRIPTION OF THE ILLUSTRATED EMBODIMENTS

Figure 1:
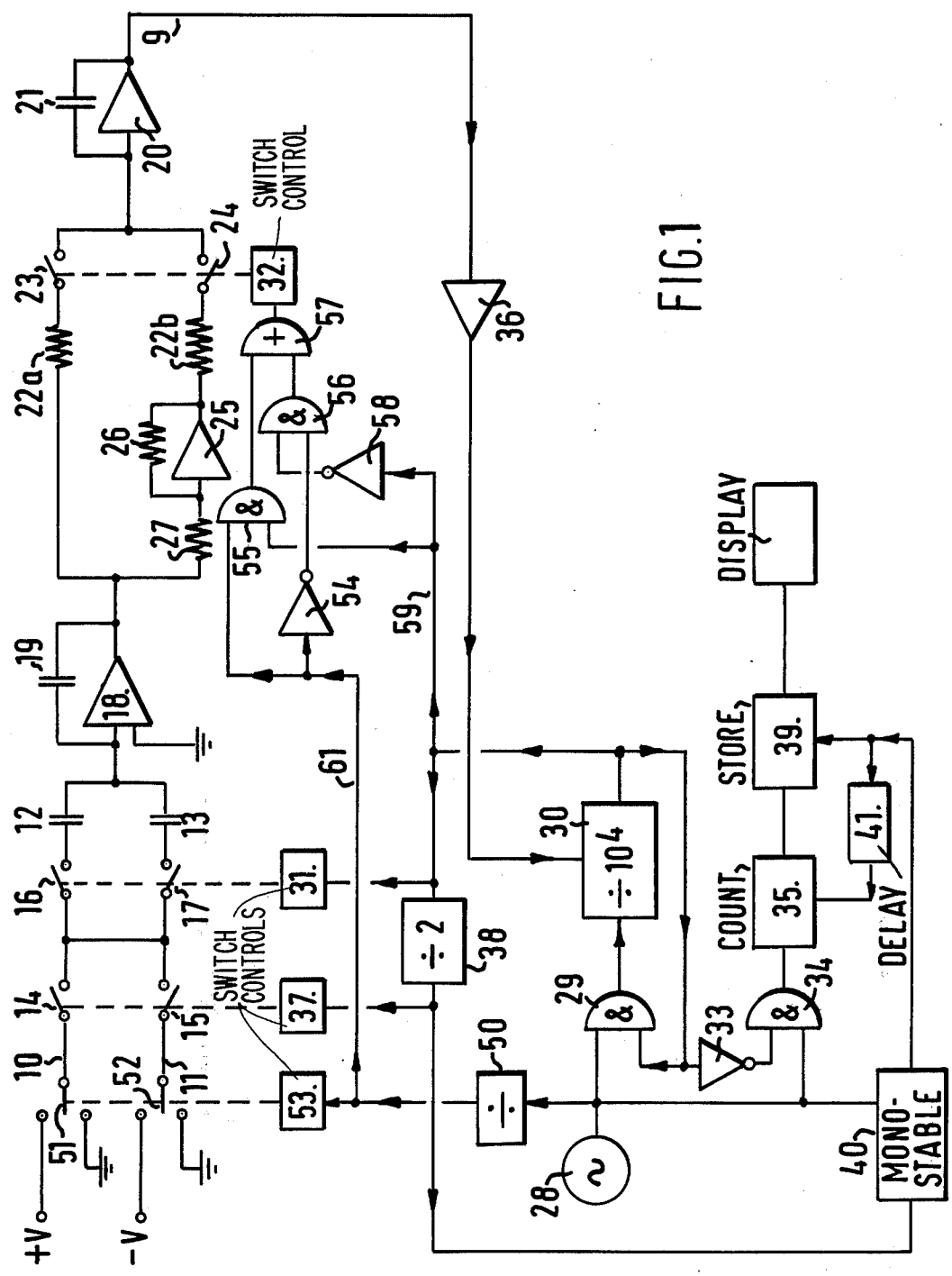
Figure 2:
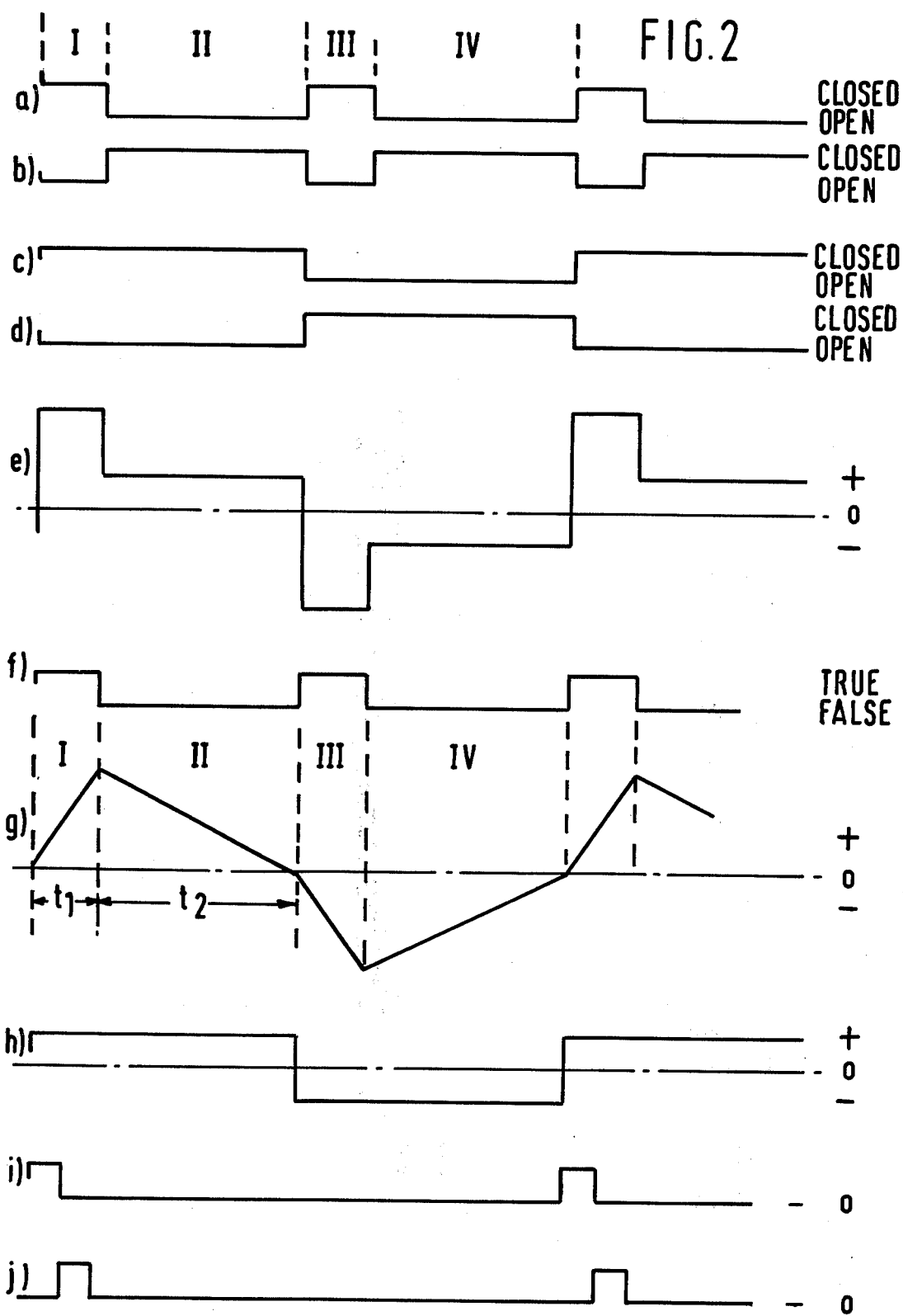

In order that the invention may be clearly understood and readily carried into effect, an embodiment thereof will now be described by way of example only with reference to the accompanying drawings wherein:

FIG. 1 is a circuit diagram of a circuit arrangement in accordance with the invention; and FIG. 2 shows waveforms appearing at various points in the arrangement of FIG. 1.

FIG. 1 shows an arrangement for measuring the ratio of two capacitors 12 and 13, having capacitances C1 and C2. The two capacitors 12 and 13 form part of a differential capacitance displacement transducer. Two sources of voltage are utilized in the arrangement described, having values +V and −V. The voltages are chopped at a relatively high frequency by means of a switch control means 53 which is connected to switches 51 and 52 (controlled by a reference signal, to be described below) to provide positive-going and negative-going rectangular waveform voltages which are applied respectively to the lines 10 and 11. The voltage to be applied is selected by switch control means 37 operating to effect closure of a switch 14 or a switch 15 connected to the respective lines 10 and 11. Switches 14 and 15 operate in antiphase, and at a frequency 100 times lower than switches 51 and 52. The selected voltage is applied to the switches 16 and 17, which operate at antiphase and then to the respective capacitors 12 and 13. The voltages +V and −V in this example have the same magnitude.

The capacitors 12 and 13 are connected with the input of a high gain inverting amplifier 18 having a feedback capacitor 19 with a capacitance C3 so that the input to the amplifier 18 forms a virtual ground for current flowing in the capacitors 12 and 13. The voltages +V and −V may be switched to either capacitor 12 or capacitor 13 by closure of switch 16 or 17 respectively, under the control of switch control means 31 and the resultant current will flow into the summing junction formed at the input of amplifier 18. The output of amplifier 18 will be a rectangular-wave alternating voltage of amplitude V.(C1/C3) or V.(C2/C3).

The output of amplifier 18 is rectified synchronously by means of switch control means 32 operating switches 23 and 24 and an inverting stage constituted by an amplifier 25 having a feedback resistor 26 and an input resistor 27. Switches 23 and 24 operate at the same frequency as switches 51 and 52 under the control of the reference signal to be described below. The demodulated signal is applied to the input of an integrator comprising an inverting amplifier 20 having a feedback capacitor 21 and an input resistor 22.

The operation of the arrangement described will be explained with reference to FIG. 2. There are four stages in the operation, indicated in FIG. 2 by the references I, II, III and IV. FIGS. 2a, b, c and d illustrate the operation of switches 16, 17, 14 and 15 respectively. FIG. 2e shows the amplitude of the waveform at the output of amplifier 18, the positive and negative values of the amplitude represent the magnitude thereof when it is in-phase and out-of-phase respectively with a reference signal. The reference signal, which has a frequency which is high compared with the repetition frequency of the switches 14 to 17 and stages I to IV, is provided on line 61 and operates the switches 51, 52 and switches 23 and 24. FIG. 2f shows the logic value of a control signal supplied on line 59 to logic 54 to 58 controlling operation of the switches 23 and 24.

In stage I, switches 14 and 16 are closed and capacitor 12 is connected to receive the chopped +V supply. The logic value of line 59 is TRUE whereby the switches 23, 24 are operated in a first phase relation relative to the chopped supply. The integrator charges so that the output increases linearly in a positive sense as may be seen in FIG. 2g.

In stage II switch 16 is opened, switch 17 is closed, and the logic value on line 59 changes to FALSE whereby the phase of operation of the switches 23, 24, relative to the phase of the reference signal, is reversed. Thus, capacitor 13 is now connected to the +V supply, but since the phase of the synchronous demodulation is reversed, the integrator 20 is charged in a negative direction as may be seen in FIG. 2g. Stage II continues until the output of integrator 20 reaches zero.

Stages III and IV are similar to stages I and II except that switch 14 is opened and switch 15 is closed. Thus, the cycle is repeated with an input voltage of reversed phase so that the phases in which the switches 23 and 24 are operated relative to the phase of the alternating supply are each reversed. Thus the integrator is charged in the negative sense during stage III and in the positive sense during stage IV.

To improve the accuracy of the equipment described, the logic which controls the switches 23, 24 can be modified so that the switches are closed only during the center portions of the alternate half-cycles. This arrangement eliminates possible inaccuracies caused by distortion of the rectangular waveform at its leading and trailing edges.

The timing of the apparatus is controlled by a clock oscillator 28 generating oscillations at a frequency of, for example, 1 MHz. The oscillations are supplied on the one hand to a frequency divider 50 to provide the reference signal and on the other hand through an AND-gate 29 to the clock input of a counter 30 able to count to $10^4$. During stage I, with the switches in the positions indicated above, the oscillations from the generator 28 are counted by the counter 30 and when a count of $10^4$ is reached, a signal appears at the output of the counter 30 which is applied to line 59 to operate switch control means 31 which controls the switches 16 and 17, and to provide a TRUE signal for the logic 54 to 58 and switch control means 32 for demodulator switches 23, 24. This terminates stage I and initiates stage II. The output from counter 30 is also applied to the logic comprising AND-gate 29, inverting amplifier 33 and AND-gate 34 to divert the clock pulses from counter 30 to counter 35.

During stage II, the clock pulse count accumulates in counter 35 until the output of integrator 20 reaches zero, whereupon a comparator 36, connected to the output of the integrator, applies a signal to counter 30 to reset the counter and, consequently, the pulse diverting logic 29, 33, 34. This terminates stage II and initiates stage III, and the counter 30 starts counting again from zero as during stage I. However, the signal on line 59 is supplied through the divide-by-two circuit 38 to the means 37 controlling switches 14, 15 so that on each alternate change-over of the switches 16, 17 and 23, 24, the +V and −V supplies are interchanged. Thus, stages III and IV occur utilizing the −V supply. The count is counter 35 continues to accumulate during stage IV, so that the recorded duration of that part of the cycle is added to that of the previous run-down part of the cycle, stage II. This averaging of the durations of stages II and IV reduces the effects of drifts and off-sets in amplifiers 18 and 20. The numerical value of the count left in counter 35 is proportional to the value of the capacitance of capacitor 12 compared with that of capacitor 13.

At the end of the four part cycle, the count in counter 35 is transferred to the store 39 in response to a trigger pulse from monostable 40, that having been activated by one edge of the output of the divide-by-two circuit 38. The counter 35 is then reset to zero by a delayed pulse from delay circuit 41 in preparation for stage I of the next cycle. FIG. 2h shows the output from the comparator 36 and FIGS. 2i and 2j illustrate the reset and delayed pulses for the store 39 and counter 35 respectively.

It will be appreciated that the arrangement described provides the advantage of drift cancellation by virtue of the summing of the periods for each sense of operation. It provides the ability to digitize low loss small value capacitance displacement transducers with great accuracy and at low cost.

The apparatus described is particularly suitable for measuring the ratio of the capacitances of a differential displacement transducer whose capacitance values vary in response to an external variable. However, with minor modification the apparatus can readily be used also for measuring the value of a single variable capacitor in terms of a fixed capacitor in a transducer. In this case, rectangular wave voltages of opposite polarity are applied to the respective fixed and variable capacitors during stages I and III, and a rectangular wave voltage is applied to only the fixed capacitor during stages II and IV. Accordingly, the output count obtained is proportional to $(C1-C2)/C2$ where C1 is the variable capacitance and C2 the fixed capacitance, and the zero point is obtained when $C1=C2$. This has a significant practical advantage in that it is especially difficult to make a variable capacitance which is linear with displacement for values of the capacitance approaching zero.

I claim:

1. A circuit arrangement for measuring the ratio of the values of first and second electrical capacitances, and arrangement comprising:
   (a) means for switching a supply voltage to provide an alternating supply voltage to each of said first and second capacitances,
   (b) synchronous demodulator means,
   (c) amplifying means coupling said capacitances to said synchronous demodulator means,
   (d) said synchronous demodulator means being connected to demodulate the alternating supply signal transmitted from said capacitors,
   (e) integrator means connected to receive the demodulated signal to provide an integral signal representative of the time-integral thereof,
   (f) control means providing a control signal to control said switch means, said control signal having first and second values whereby to provide a cycle of operation having two stages, namely a first stage wherein said alternating supply voltage is applied to said first capacitance for a first predetermined interval of time and the value of said integral signal increases from a threshold value to a value dependent on the value of said first capacitance during said first time interval and a second stage in which said alternating supply voltage is applied to said second capacitance and the value of said integral signal returns to said threshold value in a second interval of time, the value of said second interval being dependent on the value of said second capacitance, and
   (g) means for determining the value of said second time interval relative to said first time interval to provide an indication of the ratio on the values of the first and second capacitances.

2. A circuit arrangement as claimed in claim 1 wherein said duration of the first value of the control signal and of said first time interval is established from a clock source and a dividing circuit, and the duration of said second value of the control signal and of said second time interval is determined by a counter circuit connectable to said clock source, and threshold detecting means responsive to said integral signal and operable to halt said counter circuit when said integral signal reaches said threshold value in said second time interval.

3. A circuit arrangement as claimed in claim 1 wherein said first and second capacitances are variable in the manner of a differential capacitor.

4. A circuit arrangement as claimed in claim 1 in combination with a capacitance displacement transducer wherein capacitances of said transducer form said first and second capacitances, and the value of said first and second capacitances vary in response to an external variable.

5. A circuit arrangement as claimed in claim 1 including means for reversing the polarity of the integrator signal in alternate cycles of operation of said circuit arrangement.

6. A circuit arrangement as claimed in claim 1 including means for reversing the polarity of the demodulated signal provided by said demodulator in alternate cycles of operation of said circuit arrangement, and said determining means having means for averaging said ratio of time intervals over alternate cycles of operation.

* * * * *